US010220725B2

(12) United States Patent
Rush et al.

(10) Patent No.: US 10,220,725 B2
(45) Date of Patent: Mar. 5, 2019

(54) SYSTEM AND METHOD FOR PASSIVELY COOLING AN ENCLOSURE

(71) Applicant: General Electric Company, Schenectady, NY (US)

(72) Inventors: Brian Magann Rush, Niskayuna, NY (US); Joo Han Kim, Niskayuna, NY (US)

(73) Assignee: GE GLOBAL SOURCING LLC, Norwalk, CT (US)

( * ) Notice: Subject to any disclaimer, the term of this patent is extended or adjusted under 35 U.S.C. 154(b) by 789 days.

(21) Appl. No.: 14/711,405

(22) Filed: May 13, 2015

(65) Prior Publication Data

US 2016/0338221 A1 Nov. 17, 2016

(51) Int. Cl.
*H05K 7/20* (2006.01)
*B60L 15/00* (2006.01)
*H02M 1/00* (2006.01)

(52) U.S. Cl.
CPC ............. *B60L 15/007* (2013.01); *H02M 1/00* (2013.01); *H05K 7/20936* (2013.01)

(58) Field of Classification Search
None
See application file for complete search history.

(56) References Cited

U.S. PATENT DOCUMENTS

| 5,579,830 | A | 12/1996 | Giammaruti |
| 5,631,821 | A | 5/1997 | Muso |
| 5,651,414 | A * | 7/1997 | Suzuki ............... F28D 15/0275 165/104.14 |
| 5,842,514 | A * | 12/1998 | Zapach ................. H01L 23/427 165/104.33 |
| 6,082,443 | A | 7/2000 | Yamamoto et al. |
| 6,639,799 | B2 | 10/2003 | Ravi et al. |
| 7,130,193 | B2 * | 10/2006 | Hirafuji ............ H05K 7/20336 165/104.33 |
| 7,191,605 | B2 | 3/2007 | Hsu et al. |
| 7,345,877 | B2 * | 3/2008 | Asfia .................. H05K 7/20672 165/104.33 |
| 7,474,527 | B2 * | 1/2009 | Wu .......................... G06F 1/20 165/104.33 |

(Continued)

OTHER PUBLICATIONS

Sukhvinder Kang; Applied Power Electronics Conference; "Cooling for EV and HEV Applications"; Mar. 2014., 47 pgs.

(Continued)

*Primary Examiner* — Courtney Smith
(74) *Attorney, Agent, or Firm* — Christopher R. Carroll; The Small Patent Law Group LLC

(57) ABSTRACT

A system and method are provided for passively cooling an inverter subsystem within an enclosure. The method and system absorb heat generated by an inverter subsystem within an enclosure through a first heat spreader. The first heat spreader is thermally coupled to in the inverter subsystem and a first interior surface of the enclosure. The system and method transfer a portion of the heat from the first heat spreader to a second heat spreader through a plurality of heat pipes. The plurality of heat pipes are thermally coupled to the first heat spreader and the second heat spreader. The system and method further thermally couple the second heat spreader to a second interior surface of the enclosure.

20 Claims, 7 Drawing Sheets

(56) References Cited

U.S. PATENT DOCUMENTS

| | | | |
|---|---|---|---|
| 7,791,883 B2* | 9/2010 | Lin | F28D 15/0266 |
| | | | 165/104.33 |
| 7,857,037 B2* | 12/2010 | Parish | F28D 15/0233 |
| | | | 165/104.21 |
| 8,270,170 B2* | 9/2012 | Hughes | H05K 7/20445 |
| | | | 165/104.33 |
| 8,488,312 B2* | 7/2013 | Nelson | H05K 7/20681 |
| | | | 174/15.2 |
| 8,582,298 B2 | 11/2013 | Facusse et al. | |
| 2005/0201061 A1* | 9/2005 | Nikfar | F28D 15/0233 |
| | | | 361/700 |
| 2008/0112137 A1 | 5/2008 | Ko | |
| 2010/0208430 A1* | 8/2010 | Huang | H05K 7/20336 |
| | | | 361/709 |
| 2011/0116235 A1 | 5/2011 | Seunghee et al. | |
| 2014/0160679 A1* | 6/2014 | Kelty | H05K 7/20672 |
| | | | 361/700 |
| 2014/0284043 A1 | 9/2014 | Arai | |

OTHER PUBLICATIONS

2014 IEEE Applied Power Electronics Conference and Exposition (APEC 2014), Fort Worth, Texas, USA Mar. 16-20, 2014; Table of Contents; 75 pgs.

* cited by examiner

SYSTEM AND METHOD FOR PASSIVELY COOLING AN ENCLOSURE

BACKGROUND

Large electric vehicle systems such as LHD (Load, Haul, Dump) machines, underground mining vehicles, off-road or off-highway electric vehicles include one or more inverter systems housed within an enclosure. Due to the operation environment of the electric vehicle systems, the enclosure typically conforms to strict standards for robustness, which may include explosion proof certification, limiting the ability to modify the shape, size, and/or composition of the enclosure. The inverter systems provide electric power to various components of the large electric vehicles such as pump motors (e.g., hydraulic pumps), traction motors, and/or the like. During operation of the electric vehicle system, the inverter systems produce a significant amount of heat that is dissipated by the enclosure.

Conventionally, the enclosure includes a heat exchanger mounted to one wall of the enclosure and the inverter system for passive temperature control of the inverter system. For example, heat generated by the inverter system is absorbed by the heat exchanger. The heat is transferred to the wall of the enclosure by the heat exchanger and dissipated by convection into the ambient environment. However, due to the poor thermal conductivity of the enclosure, the dissipation of the heat is limited only to the wall of the enclosure, specifically, the wall in contact with the heat exchanger. This limitation reduces the cooling efficiency of the enclosure, which leads to over-temperatures of the inverter system. When over-temperatures occur, the inverter system is derated to generate less heat in order to bring down the internal temperature of the enclosure or inverter system. The derating of the inverter system limits the operation of the inverter system resulting in less productive work from the vehicle.

Alternative conventional enclosures of electric vehicle systems use an internal liquid cooling system, which forces circulation of a cooling liquid within the enclosure. However, liquid cooling systems require higher system overhead such as maintenance to prevent leakage, additional components within the enclosure for liquid flow control and delivery, and/or the like. Thus, a method and/or system is need for a more efficient way to cool the inverter system that does not modify a shape, size, and/or the like of the enclosure.

BRIEF DESCRIPTION

In an embodiment a passive cooling system within an enclosure is provided. The system includes a first heat spreader thermally coupled to an inverter subsystem and a first interior surface of the enclosure. The first heat spreader is configured to absorb heat from the inverter subsystem. The system also includes a plurality of heat pipes thermally coupled to the first heat spreader and a second heat spreader. The plurality of heat pipes are configured to transfer heat from the first heat spreader to the second heat spreader. The system further includes the second heat spreader is thermally coupled to a second interior surface of the enclosure.

In an embodiment a method for passively cooling an inverter subsystem within an enclosure is provided. The method includes absorbing heat generated by an inverter subsystem within an enclosure through a first heat spreader. The first heat spreader is thermally coupled to in the inverter subsystem and a first interior surface of the enclosure. The method also includes transferring a portion of the heat from the first heat spreader to a second heat spreader through a plurality of heat pipes. The plurality of heat pipes are thermally coupled to the first heat spreader and the second heat spreader. The method further includes thermally coupling the second heat spreader to a second interior surface of the enclosure.

In an embodiment a vehicle system is provided. The vehicle system includes an inverter subsystem configured to provide power to at least one of a traction motor or a pump motor. The vehicle system includes a passive cooling enclosure configured to control a temperature of the inverter subsystem. The passive cooling enclosure includes a first heat spreader thermally coupled to a first interior surface of the passive cooling enclosure and a second heat spreader thermally coupled to a second interior surface of the passive cooling enclosure. The passive cooling enclosure includes a plurality of heat pipes thermally coupled to the first heat spreader and a second heat spreader. The plurality of heat pipes are configured to transfer heat from the first heat spreader to the second heat spreader.

DETAILED DESCRIPTION

Figure 1:
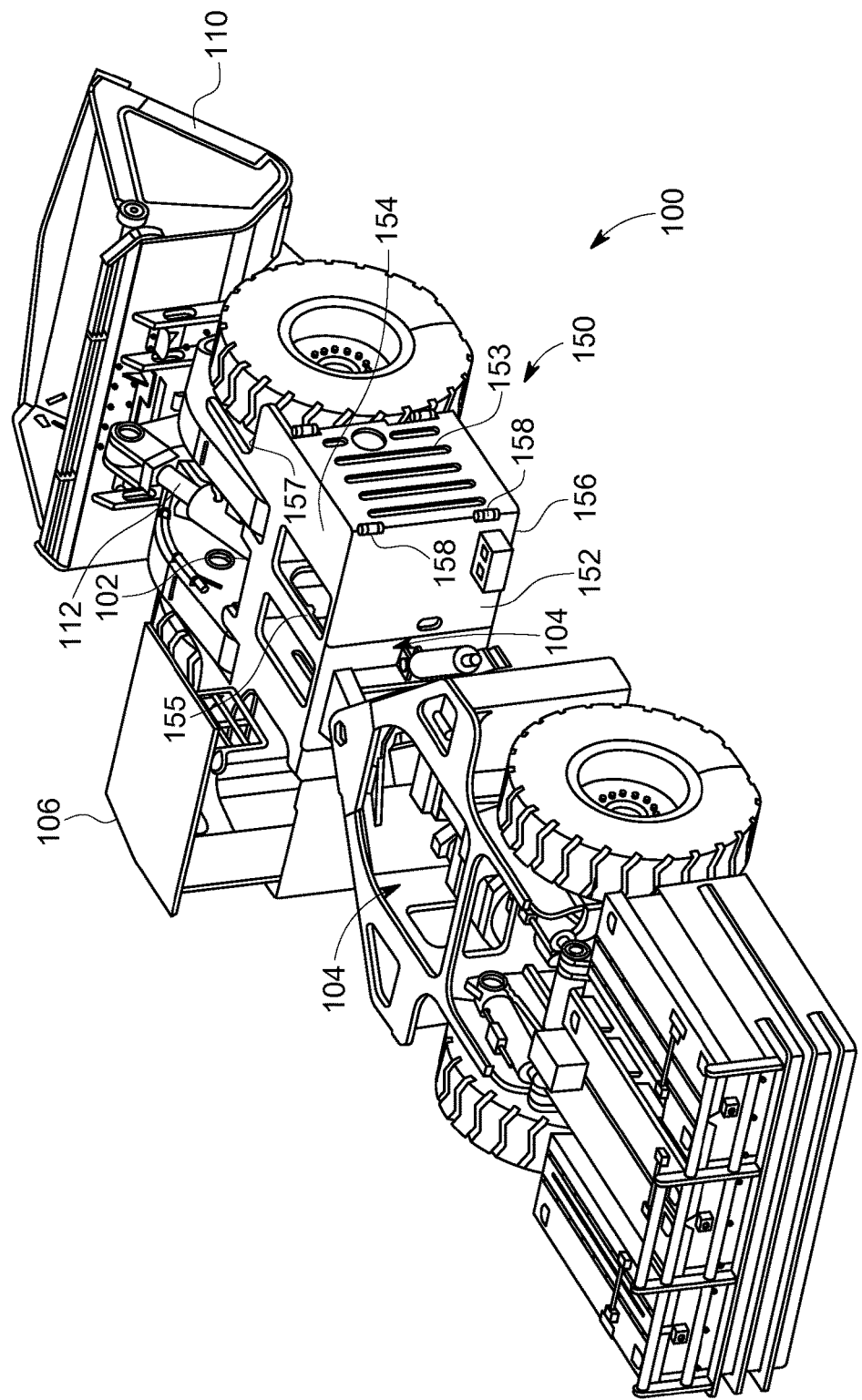
FIG. 1 is an illustrative diagram of an electric vehicle system, in accordance with an embodiment.

Various embodiments will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (e.g., processors, controllers or memories) may be implemented in a single piece of hardware (e.g., a general purpose signal processor or random access memory, hard disk, or the like) or multiple pieces of hardware. Similarly, any programs may be stand-alone programs, may be incorporated as subroutines in an operating system, may be functions in an installed software package, and the like. It should be understood that the various embodiments are not limited to the arrangements and instrumentality shown in the drawings.

As used herein, the terms "system," "unit," "subsystem," or "module" may include a hardware and/or software system that operates to perform one or more functions. For example, a module, unit, subsystem, or system may include a computer processor, controller, or other logic-based device that performs operations based on instructions stored on a tangible and non-transitory computer readable storage medium, such as a computer memory. Alternatively, a module, unit, subsystem, or system may include a hard-wired device that performs operations based on hard-wired logic of the device. The modules or units shown in the attached figures may represent the hardware that operates based on software or hardwired instructions, the software that directs hardware to perform the operations, or a combination thereof. The hardware may include electronic circuits that include and/or are connected to one or more logic-based devices, such as microprocessors, processors, controllers, or the like. These devices may be off-the-shelf devices that are appropriately programmed or instructed to perform operations described herein from the instructions described above. Additionally or alternatively, one or more of these devices may be hard-wired with logic circuits to perform these operations.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Generally, various embodiments provide methods and systems for a passive cooling system within an enclosure. For example, a system for passively cooling and/or managing heat generated by a high-power inverter subsystem within an enclosure without using mechanical movement (e.g., an internal liquid cooling system). The enclosure may be mounted to an electric vehicle system. The enclosure may include a first heat spreader embedded with heat pipes and mounted on a wall of the enclosure by thermally coupling the first heat spreader to the high-power inverter subsystem. The heat pipes are in turn embedded in another or alternate heat spreader mounted on another or alternate wall of the enclosure.

At least one technical effect of various embodiments may include effectively spreading heat generated by the inverter subsystem to two walls of the enclosure for more efficient cooling relative to conventional enclosures without externally modifying the enclosure. At least one technical effect of various embodiments may include minimizing or eliminate the need for de-rating the inverter subsystem due to inefficient heat spreading to the wall of the enclosure. At least one technical effect of various embodiments include a reliable, passive cooling solution with a higher performance at a small additional cost and lower weight relative to conventional enclosures. At least one technical effect of various embodiments may include more thermally conductive heat spreaders within the enclosure relative to conventional enclosures.

FIG. 1 is an illustrative diagram of an electric vehicle system (EVS) 100 in accordance with an embodiment. For example, the EVS 100 may represent an LHD (Load, Haul, Dump) machine, a loader, an underground mining vehicle, off-road or off-highway electric vehicles (e.g., a vehicle that is not permitted or designed for travel on public roadways), and/or the like. The EVS 100 may be operated by a user within a cockpit 106. For example, the cockpit 106 may include various user interfaces (e.g., keyboard, joystick, touchscreen, buttons) for sending various instructions to one or more components of the EVS 100. The EVS 100 may include one or more traction motors 104 (e.g., electric motors) configured to generate a tractive effort to propel the EVS 100. Optionally, the EVS 100 may include one or more additional traction motors to control components of the EVS 100. For example, additional traction motors may be used to control (e.g., reposition, move, tilt, adjust) a bucket 110 of the EVS 100.

Additionally or alternatively, the EVS 100 may include a pump motor 102. The pump motor 102 may be used to regulate hydraulic fluid to control one or more components of the EVS 100. For example, the pump motor 102 may regulate the hydraulic fluid to control a mechanical actuator such as a hydraulic cylinder 112. The hydraulic cylinder 112 may be configured to reposition, move, tilt, and/or adjust the bucket 110. In another example, the pump motor 102 may be used to propel the EVS 100. For example, the pump motor 102 may be used with one or more hydraulic motors (not shown) to generate a tractive effort to propel the EVS 100.

The EVS 100 includes one or more enclosures 150. The enclosure 150 is shown mounted to a bay of the EVS 100 which may reduce the amount of shock and/or debris that may enter the enclosure 150 during operation of the EVS 100. It should be noted that in other embodiments the enclosure 150 may be mounted in other locations of the EVS 100. The enclosure 150 may be comprised of a metal alloy, such as steel. Additionally or alternatively, the enclosure 150 may be comprised of aluminum, copper, silver, gold, stainless steel, iron, a metal composite, and/or the like. Optionally, the EVS 100 may be certified under one or more guidelines or certification processes as being explosion proof, such as ATEX, DSEAR, IECEx, USTC, and/or the like.

The enclosure 150 may be in the shape of a three orthotope (e.g., rectangular cuboid), a cube, and/or the like. For example, the enclosure 150 illustrated in FIG. 1 includes four vertical sides (e.g., side panels 152 and 157, a back panel, a front panel 153), a top panel 154, and a bottom panel 156, all of which define an interior volume 200 (shown in FIG. 2) within the enclosure 150. The enclosure 150 may further include one or more hinges 158 configured to open or close the front panel 153 providing access to the interior volume 200 to a user.

Figure 2:
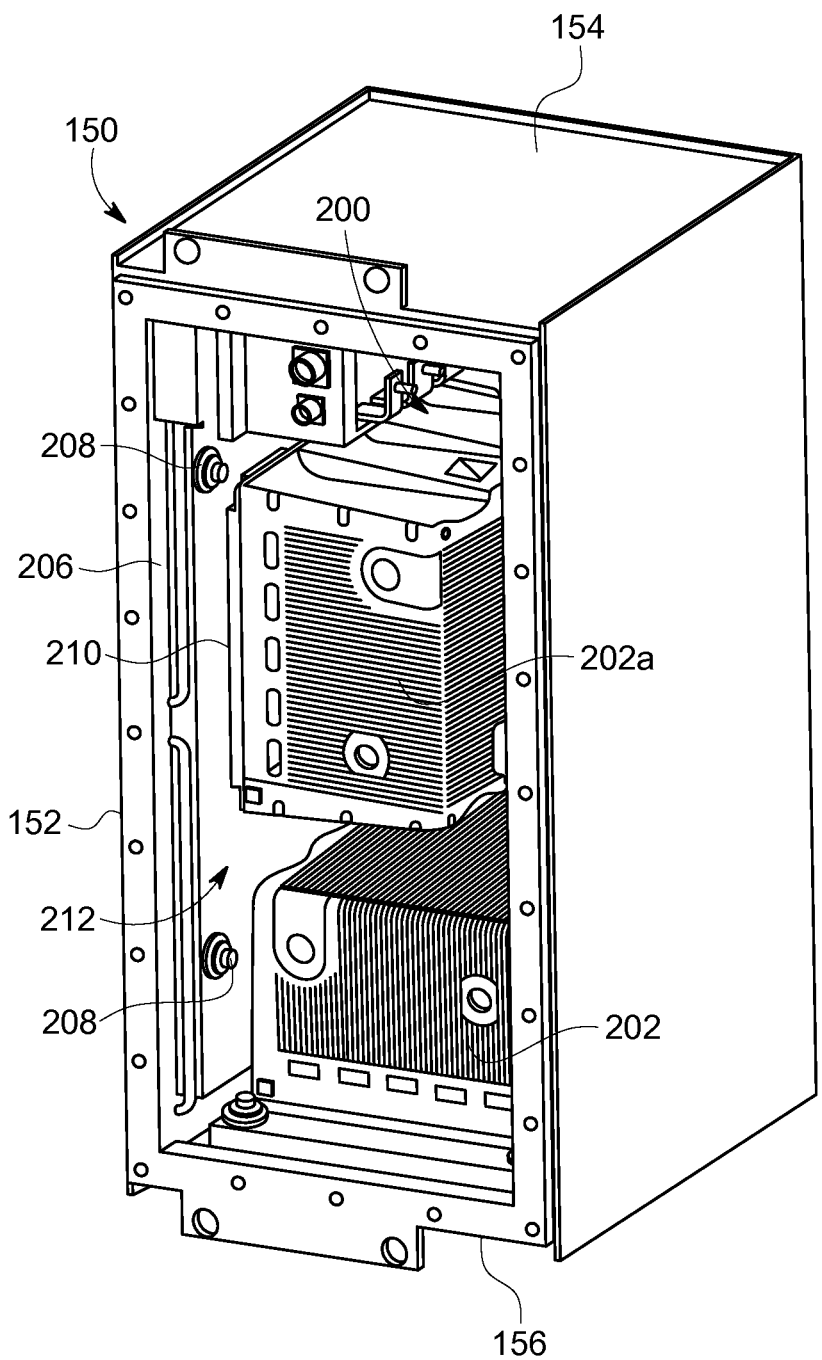
FIG. 2 is an illustrative diagram of an interior volume of an enclosure, in accordance with an embodiment.

FIG. 2 illustrates the enclosure 150 having the front panel 153 removed to show the interior volume 200 of the enclosure 150. The interior volume 200 may include one or more inverter subsystems 202 (e.g., 202a). The inverter subsystem 202 may be electrically coupled to one or more pump motors 102, one or more tractive motors 104, and/or the like. The inverter subsystem 202 may include various hardware, control logic, and/or circuitry components, such as one or more processors, capacitors, inductors, transformers, switching regulator controllers, current and/or voltage sensing circuitry, comparators, operational amplifiers, rectifiers, and/or the like. The inverter subsystem 202 may provide power (e.g., direct current (DC), alternating current (AC), voltage) to at least one of the pump motor 102, the tractive motor 104, and/or the like of the EVS 100.

For example, the inverter subsystem 202 may be electrically coupled to a DC power source such as from a battery mounted to the EVS 100, an internal power source, an external power source, and/or the like. The inverter subsystem 202 may convert or change the supplied DC to an AC to power or control the tractive motor 104 and/or pump motor 102. For example, the DC is fed to a transformer of the inverter subsystem 202. An electronic switch (e.g., transistor, relay) of the inverter subsystem 202 may continuously change a direction of the DC flow of the transformer based on a frequency of the intended AC output. The changes in flow of the DC current in the transformer produces the AC for the tractive motor 104 and/or pump motor 102. Additionally or alternatively, the inverter subsystem 202 may adjust a frequency, phase, amplitude, and/or the like of power (e.g., DC, AC, voltage) supplied to the tractive motor 104 and/or pump motor 102 by a battery mounted to the EVS 100 or an internal/external power source based on inputs received by the user within the cockpit 106.

Optionally, the inverter subsystem 202 may include one or more memory components, such as a tangible and non-transitory computer readable medium. For example, RAM, ROM, EEPROM, solid state memory (e.g., flash), and/or the like. The tangible and non-transitory computer readable medium may include one or more computer software modules. The one or more computer software modules may be configured to direct one or more processors to adjust or convert an input voltage and/or current, such as a DC from a battery mounted to the EVS 100 or an internal/external power source to an output voltage and/or current to control and/or power a pump motor 102, a tractive motor 104, and/or the like in response to user instructions received from the cockpit 106. For example, the tangible and non-transitory computer readable medium may control a rate and/or speed of the electronic switch (e.g., transistor, relay) of the inverter subsystem 202.

The inverter subsystem 202a may be thermally coupled to a first heat spreader 204 onto a surface area 212 adjacent to the inverter subsystem 202a. For example, the first heat spreader 204 may be coupled to the inverter subsystem 202a via a thermal bond 210 formed by a thermally conductive epoxy (e.g., thermal epoxy), a soldering process, a brazing process, and/or the like between the first heat spreader 204 and the inverter subsystem 202a. The first heat spreader 204 may be comprised of a thermally conductive metal such as aluminum, copper, silver, gold, stainless steel, steel, iron, a metal composite, and/or the like.

The first heat spreader 204 may be thermally coupled to a first interior surface 206 of the enclosure 150. The first heat spreader 204 may be thermally coupled to the first interior surface 206 by a thermally conductive epoxy (e.g., thermal epoxy), a soldering process, a brazing process, or the like. Optionally, the first heat spreader 204 may be attached to the first interior surface 206 via one or more fasteners 208. The first interior surface 206 corresponds to a surface area of the side panel 152 that defines or is adjacent to the interior volume 200 of the enclosure 150.

The first heat spreader 204 may be a heat exchanger, which transfers heat from one medium or component of the enclosure 150 to another. The first heat spreader 04 may be configured to absorb heat or thermal energy generated from the inverter subsystem 202a and spread the absorbed heat along the geometry of the first heat spreader 204. The first heat spreader 204 transfers the absorbed heat to a plurality of heat pipes 302 (shown in FIGS. 3 and 4) and/or the side panel 152 thermally coupled to the first heat spreader 204. For example, during operation of the inverter subsystem 202a (e.g., converting DC to AC for the tractive motor 104 and/or pump motor 102) heat is generated by one or more components of the inverter subsystem 202a. The generated heat of the inverter subsystem 202a is absorbed by the first heat spreader 204 via the thermal bond 210. The absorbed heat conducts or spreads across the geometry of the first heat spreader 204. For example, the heat is first absorbed at a portion of the first heat spreader 204 directly adjacent to the thermal bond 210, and spreads to cooler portions of the first heat spreader 204 (e.g., not adjacent to the inverter subsystem 202) remote from the thermal bond 210.

A portion of the heat absorbed by the first heat spreader 204 is transferred and/or absorbed to the side panel 152. For example, heat from the first heat spreader 204 is conducted to the first interior surface 206, which is thermally coupled to the first heat spreader 204. Heat is conducted within the geometry of the first heat interior space 206 to a corresponding exterior surface of the side panel 152, where the heat is dissipated via the ambient air.

Figure 3:
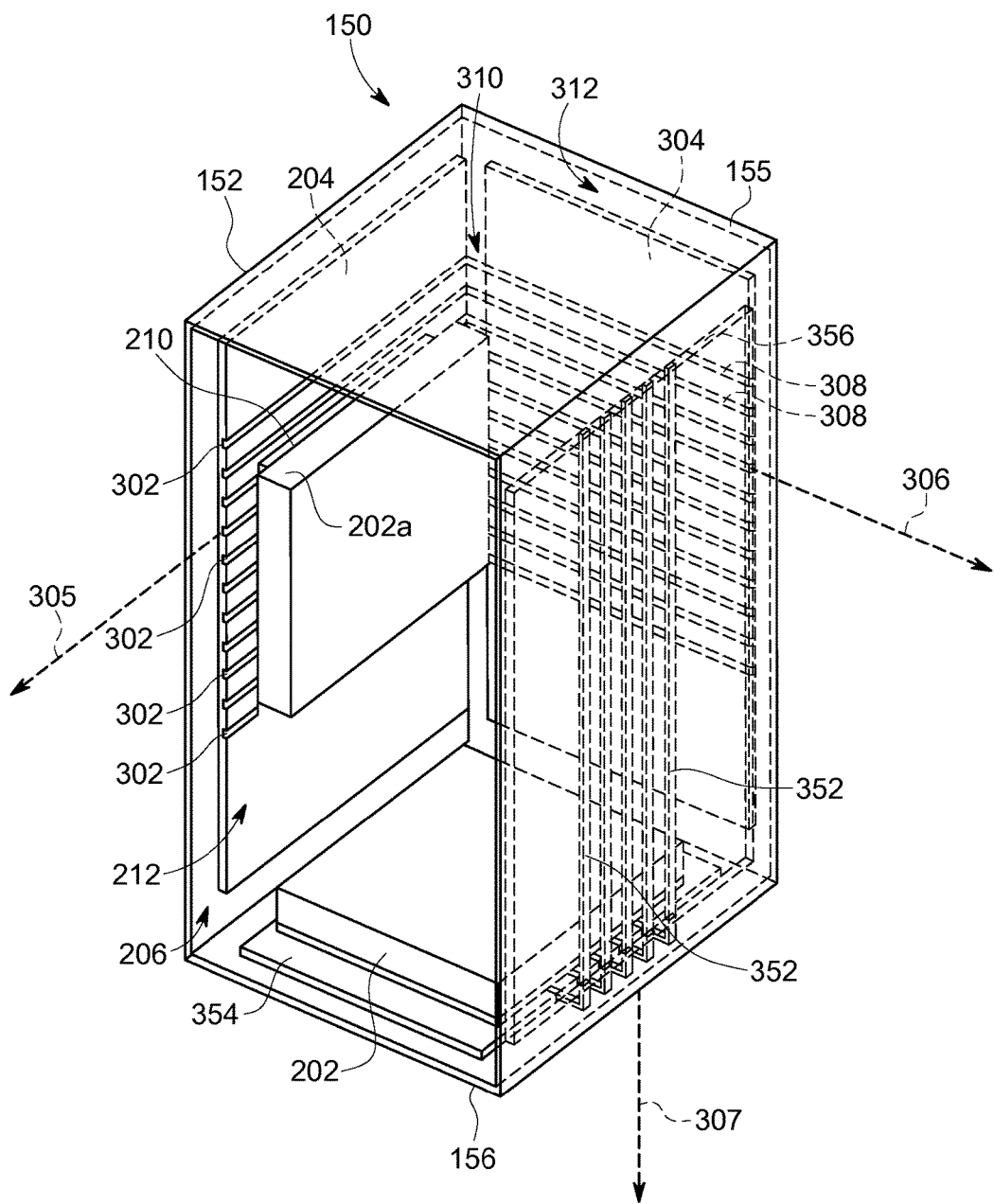
FIG. 3 is a transparent illustrative diagram of the interior volume shown in FIG. 2.

The remaining heat absorbed by the first heat spreader 204 from the inverter subsystem 202a may be absorbed or captured by the plurality of heat pipes 302 shown in FIG. 3.

FIG. 3 is a transparent illustration of the interior volume shown in FIG. 2. FIG. 3 illustrates the plurality of heat pipes 302 transverse from the first heat spreader 204 to the second heat spreader 304. For example, the plurality of heat pipes 302 extend from the first heat spreader 204 to the second heat spreader 304 parallel to a horizontal plane along an axis 305. It should be noted, other embodiments may have fewer heat pipes 302 (e.g., one, two, three, four, or the like) or more heat pipes 302 than shown in FIG. 3 (e.g., nine, ten, or the like). The plurality of heat pipes 302 are thermally coupled to the first heat reader 204 and the second heat spreader 304.

Additionally or alternatively, the plurality of heat pipes 302 may be graded or sloped (e.g., not parallel to the horizontal plane). For example, a first portion of the heat pipes 302 adjacent and/or proximate to the side panel 152 may be vertically raised (e.g., towards the top panel 154) or lowered (e.g., towards the bottom panel 157) along an axis 307 relative to a second portion of the heat pipes 302 that is adjacent and/or proximate to the side panel 155. Additionally or alternatively, two or more of the heat pipes may have different grades or slopes relative to each other.

The second heat spreader 304 may be a heat exchanger transferring heat from one medium of the enclosure 150 to another. The second heat spreader 304 may be configured to absorb heat or thermal energy from the plurality of heat pipes 302 and spread the absorbed heat along the geometry of the second heat spreader 304. The second heat spreader 304 transfers the absorbed heat to the side panel 155. The second heat spreader 304 may be comprised of the similar and/or the same material (e.g., aluminum, copper, silver, gold, stainless steel, steel, iron, a metal composite) as the first heat spreader 204. Additionally or alternatively, the second heat spreader 304 may be the same size and/or have the same dimensions as the first heat spreader 204.

The second heat spreader 304 may be thermally coupled to a second interior surface 312 of the enclosure 150. For example, the second heat spreader 304 may be coupled to the second interior surface 312 by a thermally conductive epoxy (e.g., thermal epoxy), a soldering process, a brazing process, and/or the like. Optionally, the second heat spreader 304 may be attached to the second interior surface 312 via one or more fasteners (e.g., similar to the fasteners 208 shown in FIG. 2). The second interior surface 312 corresponds to a surface area of the side panel 155 that is within the interior volume 200 of the enclosure.

As the temperature of the second heat spreader 304 increases, a portion of the heat is absorbed and/or transferred to the side panel 155. For example, heat absorbed from the plurality of heat pipes 302 within the second heat spreader 304 is conducted to the second interior surface 312. The heat is conducted within the geometry of the side panel 155 from the second interior surface 312 to an exterior surface of the side panel 155 where the heat is dissipated via the ambient air.

Figure 4A:
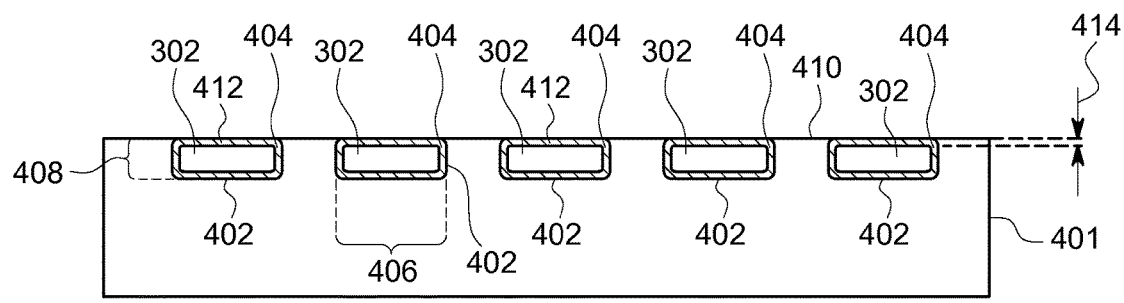
FIG. 4A is an illustrative diagram of a cross section of a heat spreader, in accordance with an embodiment.
Figure 4B:
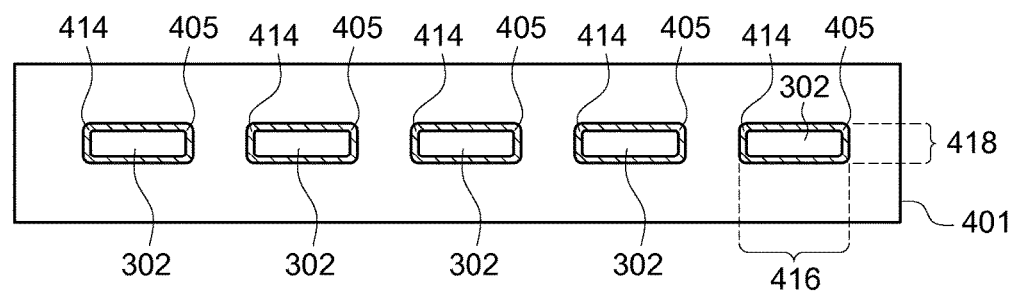
FIG. 4B is an illustrative diagram of a cross section of a heat spreader, in accordance with an embodiment.

FIGS. 4A and 4B illustrate a cross section of a heat spreader 401. The heat spreader 401 may be similar to and/or the same as the first heat spreader 204 and/or the second heat spreader 304.

In FIG. 4A, the heat spreader 401 includes a plurality of grooves 402. The grooves 402 may be machined onto a surface 410 of the heat spreader 401. Additionally or alternatively, the groves 402 may be formed into the heat spreader 401. For example, the groves 402 may be formed using a hydroforming technique. The surface 410, for example, may correspond to the surface area 212 shown in FIG. 2, a surface area of the first heat spreader 204 directly adjacent to the first interior surface 206, and/or a surface area of the second heat spreader 304 directly adjacent to the first interior surface 312. Optionally, one or more of the grooves 402 may extend along the entire surface 410 of the heat spreader 401. Additionally or alternatively, one or more of the grooves 402 may extend along a portion of the surface 410.

A direction or path of the grooves 402 extending along the surface 410 of the heat spreader 401 may be based on a direction and/or orientation of the heat pipes 302. For example, the direction or path of the grooves 402 may be graded or sloped corresponding to a grade or sloped of one or more of the heat pipes 302

Optionally, the grooves 402 may extend parallel to an axis based on an orientation and/or position of the heat spreader 402. For example, in connection to FIG. 3, the grooves (e.g., similar and/or the same as the grooves 402) of the first heat spreader 204 may extend parallel to the axis 305. The grooves of the second heat spreader 304 may extend parallel to an axis 306, which is perpendicular to the axis 305. The first heat spreader 204 and the second heat spreader 304 may each have a portion of the plurality of heat pipes 302 within the grooves, respectively, such that the plurality of heat pipes 302 extend from the grooves of each heat spreader 204, 304. For example, sections or portions of the plurality of heat pipes 302 may be positioned within corresponding grooves. A first section of the plurality of heat pipes 302 may be positioned within the grooves of the first heat spreader 204, and a second section of the plurality of heat pipes 302 may be positioned within the grooves of the second heat spreader 304.

The plurality of heat pipes 302 turn and/or change a direction at a point 310 (shown in FIG. 3) interposed between the first heat spreader 204 and the second heat spreader 304. For example, the first section of the plurality of heat pipes 302, extending parallel to the axis 305, is positioned perpendicular to the second section of the plurality of heat pipes 302, extending parallel to the axis 306. The first and second sections of the plurality of heat pipes 302 may intersect at the point 310, which may be at or approximate to the converging or meeting of the side panels 152 and 155 of the enclosure 150. The plurality of heat pipes 302 may bend and/or curve at and/or approximate to the point 310 enabling the plurality of heat pipes 302 to change direction to align with the grooves of the first heat spreader 204 and the second head spreaders 304, respectively.

Each of the plurality of heat pipes 302 are coupled to the grooves 402 via thermal bonds 404 (shown in FIG. 4A) formed by a thermally conductive epoxy (e.g., thermal epoxy), a soldering process, a brazing process, or the like. The thermal bonds 404 may surround and/or encircle the heat pipes 302. For example, the thermal bonds 404 may form a barrier between the heat pipes 302 and surrounding components, such as the heat spreader 401 and/or adjacent surfaces (e.g., the first interior surface 206, the second interior surface 312). The thermal bonds 404 may be configured to allow heat to be transferred or conducted from the heat spreader 401 (e.g., the first heat spreader 204) to the corresponding heat pipe 302 and/or from the heat pipe 302 to the heat spreader 401 (e.g., the second heat spreader 304). Additionally or alternatively, the thermal bonds 404 may be configured to allow heat to be transferred or conducted from the heat pipe 304 to an interior surface of the enclosure 150 (e.g., the first interior surface 206 the second interior surface 312) and/or side panel (e.g., the side panel 152, 155).

The grooves 402 may be configured to have dimensions enabling each of the heat pipes 302 to be contained and/or fit into a corresponding groove 402 within the heat spreader 401. For example, each groove 402 may have a width 406 and a depth 408 based on a size of the plurality of heat pipes 302. A height of the depth 408 may allow the plurality of heat pipes 302 to be positioned within the grooves 402 such that an outer surface area 412 of the heat pipes 302 may be positioned parallel to the surface 410. Additionally or alternatively, the outer surface area 412 of the heat pipes 302 may be positioned offset relative to the surface area 410. For example, the heat pipes 302 may be positioned within the heat spreader 401 such that an offset 414 between the outer surface area 412 and the surface area 410 is formed.

In FIG. 4B, the heat spreader 401 includes a plurality of cavities 414. The cavities 414 may be machined or formed into the heat spreader 401. Optionally, one or more of the cavities 414 may extend along a length the heat spreader 401 allowing the plurality of heat pipes 302 to extend through the heat spreader 401, as shown in relation to the heat pipes 302 and the first and second heat spreaders 204 and 304. Additionally or alternatively, one or more of the cavities 414 may terminate within the heat spreader 401. A direction or path of the cavities 414 extending within the heat spreader 401 may be based on a direction and/or orientation of the heat pipes 302. For example, the direction or path of the cavities 414 may be graded or sloped corresponding to a grade or sloped of one or more of the heat pipes 302. Additionally or alternatively, the cavities 414 may extend parallel to an axis based on an orientation and/or position of the heat spreader 401. For example, in connection to FIG. 3, the cavities 414 may extend parallel to the axis 305 and/or may extend parallel to the axis 306.

Similar to the grooves 402 described in FIG. 4A, in an embodiment, the first heat spreader 204 and the second heat spreader 304 may each have a portion of the plurality of heat pipes 302 within the cavities, respectively, such that the plurality of heat pipes 302 may extend from the cavities of each heat spreader 204, 304. For example, sections or portions of the plurality of heat pipes 302 may be positioned within corresponding cavities. A first section of the plurality of heat pipes 302 may be positioned within the cavities of the first heat spreader 204, and a second section of the plurality of heat pipes 302 may be positioned within the cavities of the second heat spreader 304.

The plurality of heat pipes 302 are coupled to each of the cavities 414 via the thermal bonds 405 formed by a thermally conductive epoxy (e.g., thermal epoxy), a soldering process, a brazing process, or the like. The thermal bonds 405 may surround and/or encircle the heat pipes 302 based on a shape of the cavities 414. For example, a section or portion of the heat pipes 302 may be positioned within the cavities 414. A thermally conductive epoxy may be injected into the cavities 414, forming the thermal bonds 405. The thermal bonds 405 may conform to the shape of the cavities 414 creating a barrier between the heat pipes 302 and the surrounding heat spreader 401 (e.g., the first heat spreader 204, the second heat spreader 304). The thermal bonds 405 may be configured to allow heat to be transferred or conducted from the heat spreader 401 (e.g., the first heat spreader 204) to the corresponding heat pipe 302 and/or from the heat pipe 302 to the heat spreader 401 (e.g., the second heat spreader 304).

The cavities 414 may be configured to enclose and/or encircle the sections or portions of the heat pipes 302 within the cavities 414. The cavities 414 may include dimensions enabling each of the heat pipes 302 to be contained and/or enclosed into the corresponding cavity 414. For example, each cavity 414 may have a width 416 and a depth 418 based on (e.g., larger than) a size of the plurality of heat pipes 302.

Additionally or alternatively, the enclosure 150 may include a plurality of heat pipes 352 extending along a vertical plane. For example, the enclosure 150 may include additional heat spreaders 354 and 356. The heat spreader 354 may be similar to and/or the same as the first heat spreader 204. The heat spreader 356 may be similar to and/or the same as the second heat spreader 304. The plurality of heat pipes 352 may extend from the heat spreader 354 to the heat spreader 356 parallel to a vertical plane defined by the axis 307.

For example, in connection to FIG. 3, the grooves (e.g., similar and/or the same as the grooves 402) of the heat spreader 354 may extend parallel to the axis 306. The grooves of the heat spreader 356 may extend parallel to an axis 307, which is perpendicular to the axis 306. The heat spreaders 354 and 356 may each have a portion of the plurality of heat pipes 352 within the grooves, respectively, such that the plurality of heat pipes 352 extend from the grooves of each heat spreader 354, 356.

Figure 5:
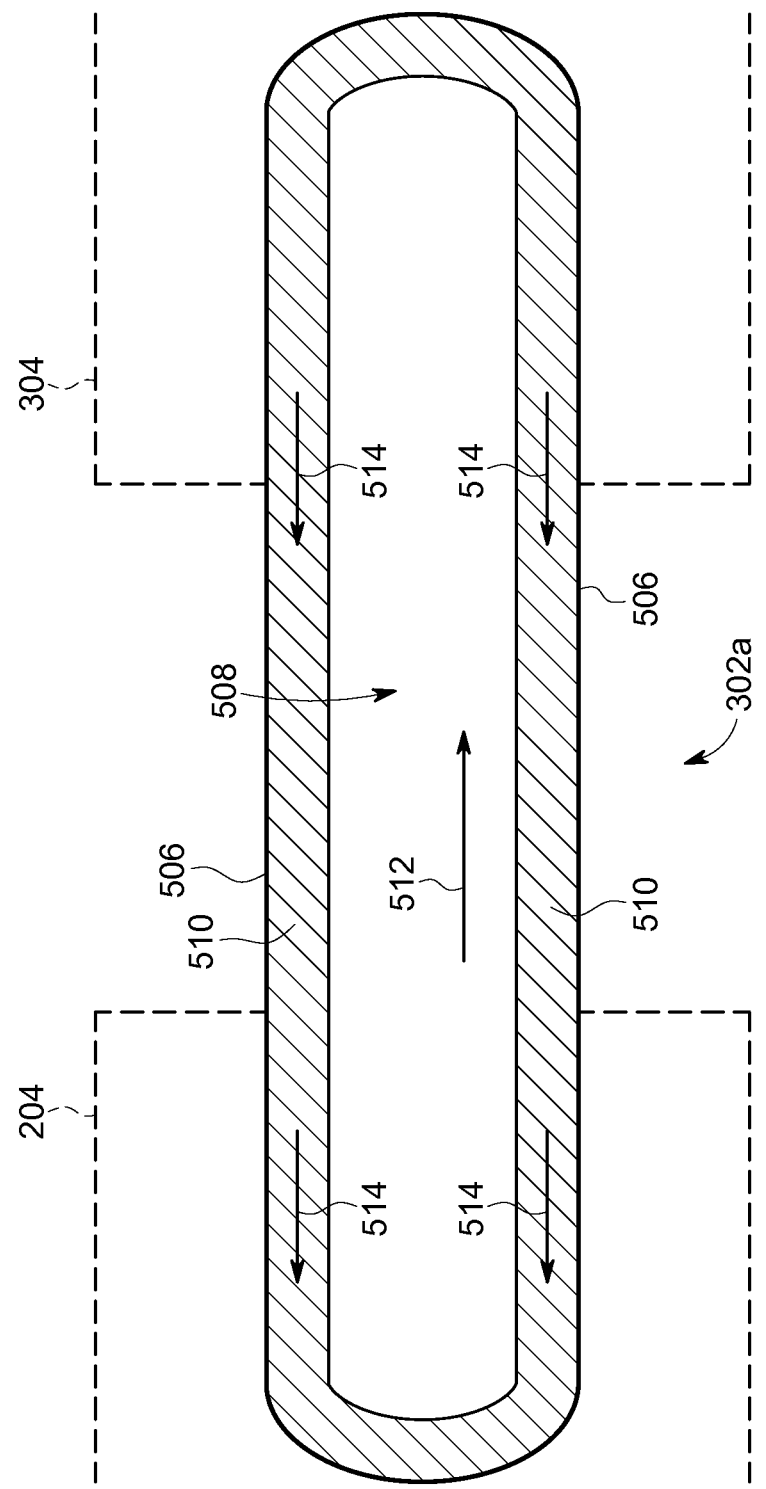
FIG. 5 is a cross section of a heat pipe, in accordance with an embodiment.

FIG. 5 is a cross section of a heat pipe 302a selected from the plurality of heat pipes 302 (shown in FIG. 3). The heat pipes 302 are configured to transfer heat from the first heat spreader 204 to the second heat spreader 304. In an embodiment, the heat pipes 302 may not include any moving mechanical parts thereby passively transferring heat from the first heat spreader 204 to the second heat spreader 304. The heat pipes 302 may each be formed by a sealed pipe and/or tube casing 506 made of a thermally conductive material, such as copper, aluminum, and/or the like. The plurality of heat pipes 302 may be in the shape of a cylinder structure, elliptical cylinder, and/or the like. The tube casing 506 of the plurality of heat pipes 302 may contain a cavity 508 and a wick 510 (e.g., capillary structure). The cavity 508 of the plurality of heat pipes 302 may be partially filled with a working fluid. The working fluid may be water, ammonia, ethanol, and/or the like.

The wick 510 is positioned between the cavity 508 and the tube casing 506. The wick 510 may be formed by a sintered metal powder, a screen or wire mesh, a series of grooves, fiber/spring, and/or the like. The wick 510 is configured to condense the working fluid from a vapor by exerting a capillary action on the working fluid.

For example, a portion of the heat pipe 302a is surrounded and/or positioned within the groove or cavity of the first heat spreader 204. A second portion of the heat pipe 302a is surrounded and/or positioned within the groove or cavity of the second heat spreader 304. Heat is generated by the inverter subsystem 202a (shown in FIGS. 2 and 3), and is absorbed by the first heat spreader 204. Heat is conducted via the thermal bond 405 from the first heat spreader 204 to the casing 506 of the heat pipe 302a. A temperature differential forms between a portion of the heat pipe 302a within the first heat spreader 204 and a portion of the heat pipe 302a within the second heat spreader 304. The temperature differential allows thermal conductivity of the heat pipe 302a (e.g., transferring heat from the first heat spreader 204 to the second heat spreader 304) and phase transition (e.g., vaporization, condensation) of the working fluid within the heat pipe 302a.

For example, the heat or thermal energy received by the heat pipe 302a from the first heat spreader 204 may be absorbed by a portion of the working fluid, which is vaporized. Generally, the heat or thermal energy may increase a rate of evaporation of the working fluid within the heat pipe 302a. The vapor may flow or migrate within the cavity 508 in a direction of an arrow 512 towards the second heat spreader 304. The direction of the vapor flow is based on the temperature differential between the first and second heat spreader 204 and 304. For example, the direction of the vapor flow proceeds from a higher temperature of the heat pipe 302a to a relatively lower temperature of the heat pipe 302a.

As the vapor flows within a portion of the heat pipe 302a located within the second heat spreader 304, the temperature of the heat pipe 302a adjacent to and/or in contact with the vapor decreases. The decrease in temperature condenses the vapor. The condensed vapor is absorbed by the wick 510 returning to a liquid, which releases heat and/or thermal energy. The released heat and/or thermal energy is radiated from the heat pipe 302a, which is absorbed by the second heat spreader 304 via the thermal bond 405. The wick 510 may exert a capillary action on the working liquid, which flows the working liquid in a direction of arrows 514 towards the first heat spreader 204.

Optionally, an external force may be used to aid in the flow of the working liquid, such as a gravitational force. For example, the heat pipes 352 may extend along a vertical plane parallel to the axis 307. A portion of the heat pipes 352 are surrounded and/or positioned within the heat spreader 354 (e.g., using the grooves 402 or the cavities 414), and a second portion of the heat pipes 352 are surrounded and/or positioned within the heat spreader 356. Heat is generated by the inverter subsystem 202 (shown in FIGS. 2 and 3), and is absorbed by the heat spreader 354. Heat is conducted via the thermal bond 405 from the heat spreader 354 to the plurality of heat pipes 352. The heat or thermal energy received by the heat pipes 352 is absorbed by a portion of the working fluid, which is vaporized. The vapor may rise within the heat pipes 352 towards the heat spreader 356. As the vapor flows within a portion of the heat pipes 352 located within the heat spreader 356, vapor condenses and is absorbed by wicks (e.g., similar to and/or the same as the wick 510) of the heat pipes 352 returning to a liquid, which releases heat and/or thermal energy. The capillary action exerted by the wick may be aided by the gravitational force pulling the working liquid from a position within the heat pipes 352 proximate to the heat spreader 356 towards the heat spreader 354. Additionally or alternatively, the plurality of heat pipes 302, 352 may be graded to allow a gravitational force to aid in the flow of the working fluid.

Figure 6:
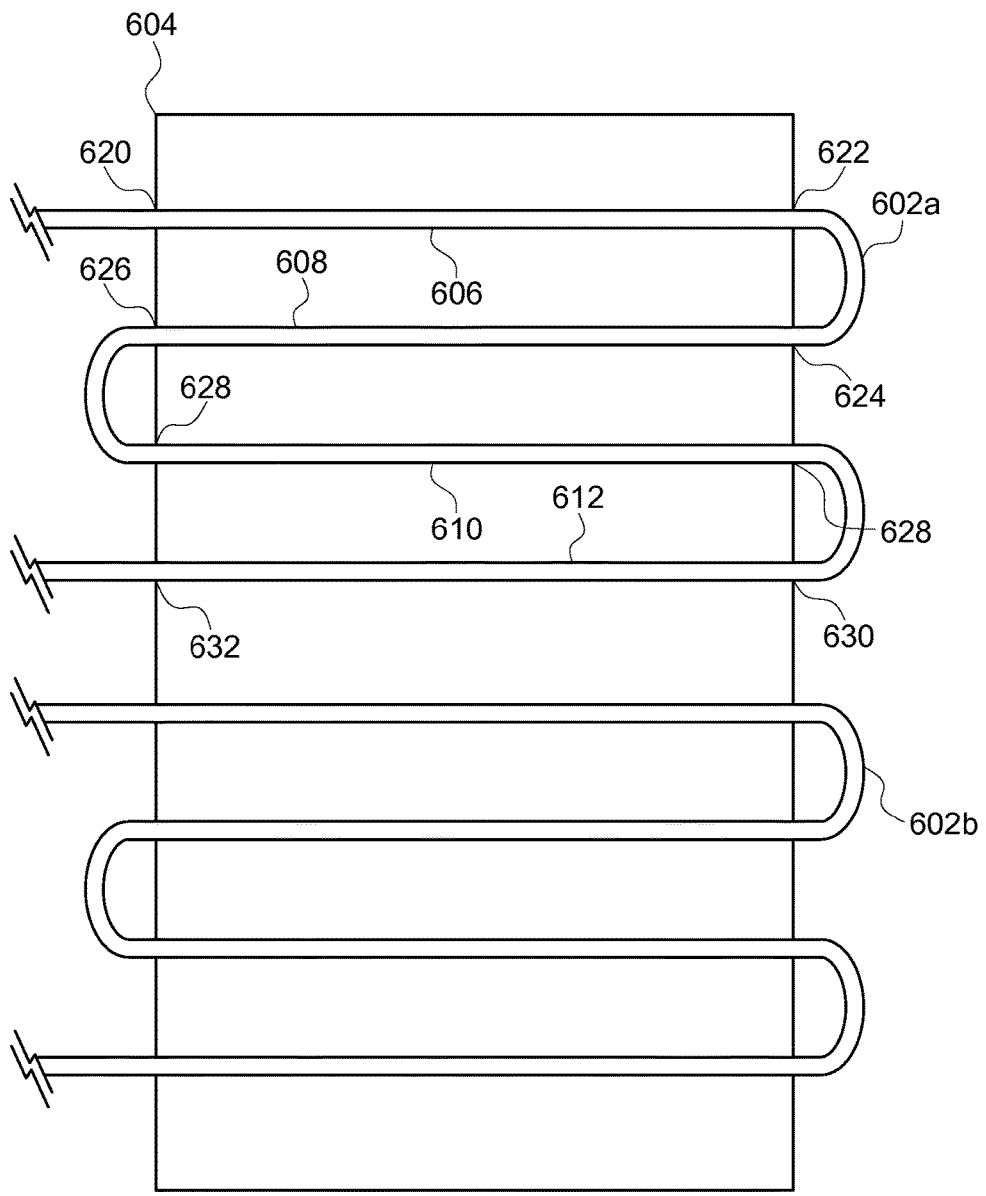
FIG. 6 is an illustration of a cross section of a heat spreader, in accordance with an embodiment.

Optionally, in connection with FIG. 6, one or more heat pipes 602 may be configured as a crossed-over and/or looped heat pipe. FIG. 6 illustrates a cross section of a heat spreader 604. A plurality of lopped heat pipes 602a-b are thermally coupled within the heat spreader 604. The heat spreader 604 may be similar to and/or the same as the first heat spreader 204 and/or the second heat spreader 304. The looped heat pipes 602a-b may coil within the heat spreader 604 along a plurality of grooves or cavities of the heat spreader 604. The grooves or cavities may be similar to and/or the same as the grooves 402 or cavities 414 as described in connection to FIGS. 4A-B. The grooves or cavities of the heat spreader 604 enable the looped heat pipe 602a to coil or transverse the heat spreader 604 more than once.

For example, a first portion 606 of the looped heat pipe 602a may extend from a separate or other heat spreader (e.g., the first heat spreader 204) into the heat spreader 604 (e.g., the second heat spreader 304) at 620. Optionally, the first portion 606 of the looped heat pipe 602a may extend from an end of the looped heat pipe 602a. The first portion 606 of the looped heat pipe 602a may extend through the heat spreader 604 along a first groove exiting the heat spreader 604 at 622. The looped heat pipe 602a may curve and/or bend from 622 to transverse the looped heat pipe 602a into the heat spreader 604 at 624 forming a second portion 608.

Additionally or alternatively, as illustrated in FIG. 6, the looped heat pipe 602a may further coil or transverse the heat spreader 604 more than twice. For example, the second portion 608 of the looped heat pipe 602a may extend through the heat spreader 604 along a second groove exiting the heat spreader 604 at 626. The looped heat pipe 602a may curve and/or bend from 626 to transverse the looped heat pipe 602a into the heat spreader 604 at 628 forming a third portion 610. The third portion 610 of the looped heat pipe 602a may extend through the heat spreader 604 along a third groove exiting the heat spreader 604 at 628. The looped heat pipe 602a may curve and/or bend from the 628 to transverse the looped heat pipe 602a into the heat spreader 604 at 630 forming a fourth portion 612. The fourth portion 612 of the looped heat pipe 602a may extend through the heat spreader 604 along a fourth groove exiting the heat spreader 604 at 632.

Optionally, the looped heat pipe 602a may terminate within the heat spreader 604 and/or at a point outside the heat spreader 604. Additionally or alternatively, the looped heat pipe 602a may return to the separate or other heat spreader forming a closed loop. For example, connecting to a portion of the looped heat pipe 602a within the separate or other heat spreader.

Figure 7:
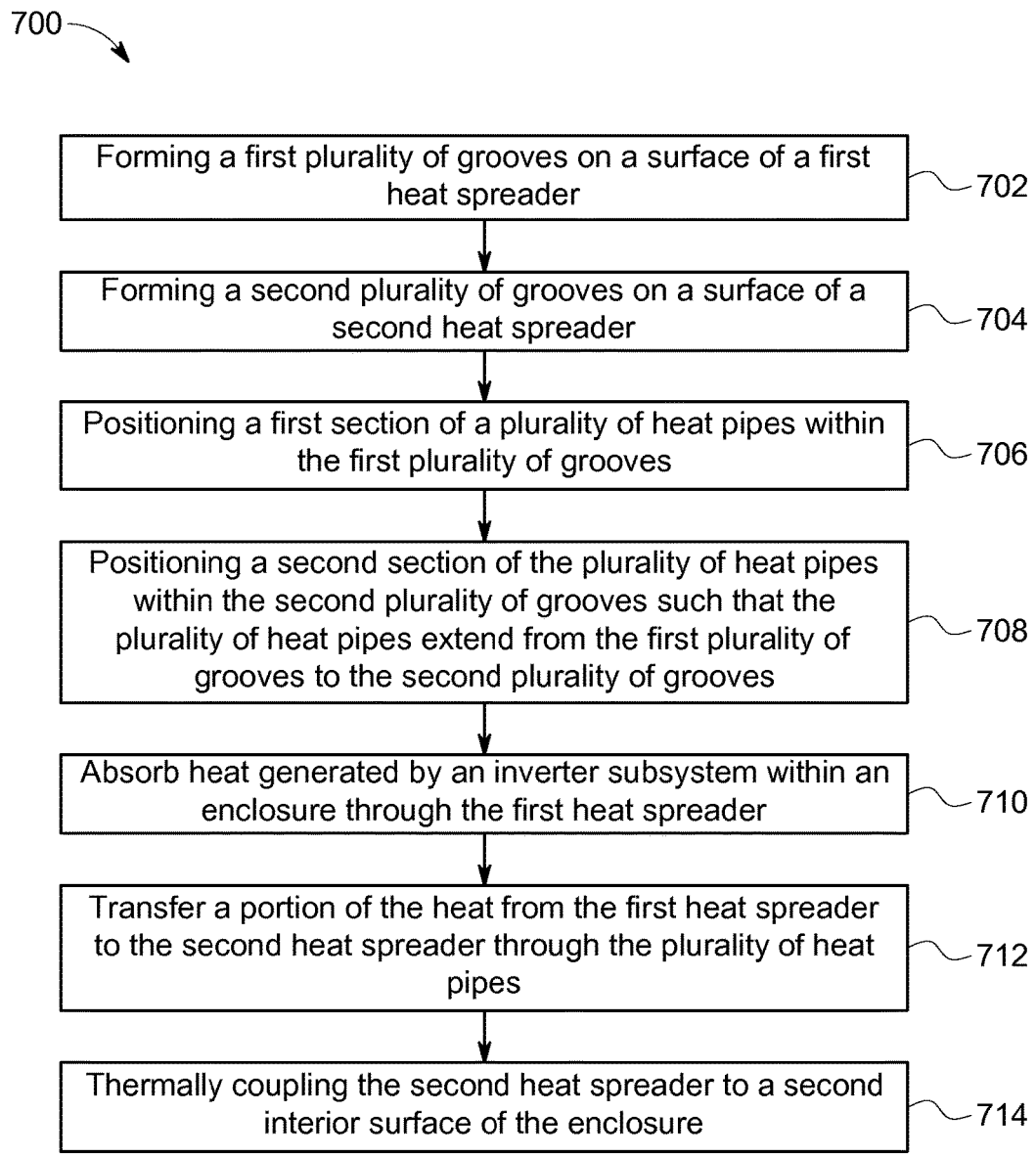
FIG. 7 is a flowchart of a method for passively cooling an inverter subsystem, in accordance with an embodiment.

FIG. 7 illustrates a flowchart of a method 700 for passively cooling an inverter subsystem within an enclosure. The method 700, for example, may employ structures or aspects of various embodiments (e.g., systems and/or methods) discussed herein. In various embodiments, certain steps (or operations) may be omitted or added, certain steps may be combined, certain steps may be performed simultaneously, certain steps may be performed concurrently, certain steps may be split into multiple steps, certain steps may be performed in a different order, or certain steps or series of steps may be re-performed in an iterative fashion. In various embodiments, portions, aspects, and/or variations of the method 600 may be used as one or more algorithms to direct hardware to perform one or more operations described herein. It should be noted, other methods may be used, in accordance with embodiments herein.

One or more methods may (i) absorb heat generated by an inverter subsystem within an enclosure through a first heat spreader, (ii) transferring a portion of the heat from the first heat spreader to a second heat spreader through a plurality of heat pipes, and (iii) thermally coupling the second heat spreader to a second interior surface of the enclosure.

Beginning at 702, a first plurality of grooves are formed on a surface of the first heat spreader 204. For example, the first plurality of grooves may be similar to and/or the same as the grooves 402 shown in FIG. 2. The first plurality of grooves may be machined and/or formed on the surface area 212 of the first heat spreader 204. Additionally or alternatively, the first plurality of grooves may be formed on a surface area of the first heat spreader 204 adjacent to the first interior surface 206.

At 704, a second plurality of grooves are formed on a surface of a second heat spreader 304. For example, the second plurality of grooves may be similar to and/or the same as the grooves 402 shown in FIG. 2. The second plurality of grooves may be machined and/or formed on the surface area 312 of the second heat spreader 304. Additionally or alternatively, the second plurality of grooves may be formed on a surface area of the second heat spreader 304 proximate to the opposing side panel (e.g., the front panel 156).

At 706, a first section of the plurality of heat pipes 302 are positioned within the first plurality of grooves. For example, the first plurality of grooves is configured with dimensions enabling the first section of the heat pipes 302 to be contained and/or fit into a corresponding groove of the first plurality of grooves within the first heat spreader 204. The first section of the plurality of heat pipes 302 may be positioned within the first plurality of grooves.

At 708, a second section of the plurality of heat pipes 302 are positioned within the second plurality of grooves such that the plurality of heat pipes 302 extend from the first plurality of grooves to the second plurality of grooves. For example, the second plurality of grooves is configured with dimensions enabling the second section of the heat pipes 302 to be contained and/or fit into a corresponding groove of the second plurality of grooves within the second heat spreader 304. The second section of the plurality of heat pipes 302 may be positioned within the second plurality of grooves.

At 710, heat generated by the inverter subsystem 202 within the enclosure 150 is absorbed through the first heat spreader 204. For example, the heat generated by the inverter subsystem 202 may be absorbed by the first heat spreader 204 via the thermal bond (e.g., the thermal bond 405), and conducted throughout a geometry of the first heat spreader 204.

At 712, a portion of the heat from the first heat spreader 204 is transferred to the second heat spreader 304 through the plurality of heat pipes 302. For example, a portion of the heat may be absorbed by the interior surface 206 of the side panel 152. Another portion of the heat may be absorbed by the first section of the plurality of heat pipes 302 via the thermal bond within the first heat spreader 204. The absorbed heat of the heat pipes 302 transitions the working liquid within the plurality of heat pipes 302 into a vapor. The vapor flows from the first section to the second section of the plurality of heat pipes 302. At the second section, the vapor condenses and is absorbed by the wicks 510, which releases the thermal energy or heat from the first section. The released heat is radiated from the plurality of heat pipes 302 and absorbed by the second heat spreader 304 via the thermal bond, transferring heat from the first heat spreader 204 to the second heat spreader 304.

At 714, the second heat spreader 304 is thermally coupled to the second interior surface 312 of the enclosure 150. For example, the second heat spreader 304 may be coupled to the second interior surface 312 by a thermally conductive epoxy (e.g., thermal epoxy), a soldering process, a brazing process, or the like. Optionally, the second heat spreader 304 may be attached to the second interior surface 312 via one or more fasteners (e.g., similar to the fasteners 208 shown in FIG. 2).

It should be noted that the particular arrangement of components (e.g., the number, types, placement, or the like)

of the illustrated embodiments may be modified in various alternate embodiments. For example, in various embodiments, different numbers of a given module or unit may be employed, a different type or types of a given module or unit may be employed, a number of modules or units (or aspects thereof) may be combined, a given module or unit may be divided into plural modules (or sub-modules) or units (or sub-units), one or more aspects of one or more modules may be shared between modules, a given module or unit may be added, or a given module or unit may be omitted.

As used herein, a structure, limitation, or element that is "configured to" perform a task or operation may be particularly structurally formed, constructed, or adapted in a manner corresponding to the task or operation. For purposes of clarity and the avoidance of doubt, an object that is merely capable of being modified to perform the task or operation is not "configured to" perform the task or operation as used herein. Instead, the use of "configured to" as used herein denotes structural adaptations or characteristics, and denotes structural requirements of any structure, limitation, or element that is described as being "configured to" perform the task or operation. For example, a processing unit, processor, or computer that is "configured to" perform a task or operation may be understood as being particularly structured to perform the task or operation (e.g., having one or more programs or instructions stored thereon or used in conjunction therewith tailored or intended to perform the task or operation, and/or having an arrangement of processing circuitry tailored or intended to perform the task or operation). For the purposes of clarity and the avoidance of doubt, a general purpose computer (which may become "configured to" perform the task or operation if appropriately programmed) is not "configured to" perform a task or operation unless or until specifically programmed or structurally modified to perform the task or operation.

It should be noted that the various embodiments may be implemented in hardware, software or a combination thereof. The various embodiments and/or components, for example, the modules, or components and controllers therein, also may be implemented as part of one or more computers or processors. The computer or processor may include a computing device, an input device, a display unit and an interface, for example, for accessing the Internet. The computer or processor may include a microprocessor. The microprocessor may be connected to a communication bus. The computer or processor may also include a memory. The memory may include Random Access Memory (RAM) and Read Only Memory (ROM). The computer or processor further may include a storage device, which may be a hard disk drive or a removable storage drive such as a solid state drive, optic drive, and the like. The storage device may also be other similar means for loading computer programs or other instructions into the computer or processor.

As used herein, the term "computer," "controller," and "module" may each include any processor-based or microprocessor-based system including systems using microcontrollers, reduced instruction set computers (RISC), application specific integrated circuits (ASICs), logic circuits, GPUs, FPGAs, and any other circuit or processor capable of executing the functions described herein. The above examples are exemplary only, and are thus not intended to limit in any way the definition and/or meaning of the term "module" or "computer."

The computer, module, or processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer, module, or processor as a processing machine to perform specific operations such as the methods and processes of the various embodiments described and/or illustrated herein. The set of instructions may be in the form of a software program. The software may be in various forms such as system software or application software and which may be embodied as a tangible and non-transitory computer readable medium. Further, the software may be in the form of a collection of separate programs or modules, a program module within a larger program or a portion of a program module. The software also may include modular programming in the form of object-oriented programming The processing of input data by the processing machine may be in response to operator commands, or in response to results of previous processing, or in response to a request made by another processing machine.

As used herein, the terms "software" and "firmware" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program. The individual components of the various embodiments may be virtualized and hosted by a cloud type computational environment, for example to allow for dynamic allocation of computational power, without requiring the user concerning the location, configuration, and/or specific hardware of the computer system.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f) unless and until such claim limitations expressly use the phrase "means for" followed by a statement of function void of further structure.

This written description uses examples to disclose the various embodiments, and also to enable a person having ordinary skill in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal languages of the claims.

The foregoing description of certain embodiments of the present inventive subject matter will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (for example, processors or memories) may be implemented in a single piece of hardware (for example, a general purpose signal processor, microcontroller, random access memory, hard disk, or the like). Similarly, the programs may be stand alone programs, may be incorporated as subroutines in an operating system, may be functions in an installed software package, or the like. The various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "comprises," "including," "includes," "having," or "has" an element or a plurality of elements having a particular property may include additional such elements not having that property.

What is claimed is:

1. A passive cooling system and an inverter subsystem within an enclosure, the passive cooling system comprising:
   a first heat spreader thermally coupled to the inverter subsystem and attached to a first interior surface of the enclosure, wherein the first heat spreader is configured to absorb heat from the inverter subsystem and configured to conduct heat to the first interior surface of the enclosure;
   a plurality of heat pipes thermally coupled to the first heat spreader and a second heat spreader, wherein the plurality of heat pipes are configured to transfer heat from the first heat spreader to the second heat spreader; and
   the second heat spreader is attached to a second interior surface of the enclosure and configured to conduct heat to the second interior surface of the enclosure, wherein the second interior surface corresponds to a surface area of a side panel, and wherein the side panel is within an interior volume of the enclosure.

2. The passive cooling system of claim 1, wherein the first heat spreader includes a first plurality of grooves parallel to a first axis of the enclosure and the second heat spreader includes a second plurality of grooves parallel to a second axis of the enclosure perpendicular to the first axis.

3. The passive cooling system of claim 2, wherein a first section of the plurality of heat pipes is positioned within the first plurality of grooves and a second section of the plurality of heat pipes is positioned within the second plurality of grooves, the plurality of heat pipes extending from the first plurality of grooves to the second plurality of grooves.

4. The passive cooling system of claim 1, wherein a first section of the plurality of heat pipes is positioned perpendicular to a second section of the plurality of heat pipes.

5. The passive cooling system of claim 1, wherein the plurality of heat pipes extend from the first heat spreader to the second heat spreader, and wherein the plurality of heat pipes are parallel to a horizontal plane of the enclosure or a vertical plane of the enclosure.

6. The passive cooling system of claim 1, wherein the first heat spreader and the second heat spreader comprise at least one of aluminum, stainless steel, steel, copper, gold, iron, or silver.

7. The passive cooling system of claim 1, wherein the first heat spreader includes a first plurality of cavities configured to enclose a first section of the plurality of heat pipes, and the second heat spreader includes a second plurality of cavities configured to enclose a second section of the plurality of heat pipes.

8. The passive cooling system of claim 1, further comprising an electric vehicle system, wherein the inverter subsystem is configured to provide power to at least one of a traction motor or a pump motor of the electric vehicle system.

9. The passive cooling system of claim 6, wherein the enclosure comprises at least one of steel, aluminum, stainless steel, copper, gold, iron, or silver.

10. A method for passively cooling an inverter subsystem within an enclosure, the method comprising:
    absorbing heat generated by the inverter subsystem within the enclosure through a first heat spreader, wherein the first head spreader is thermally coupled to the inverter subsystem and attached to a first interior surface of the enclosure;
    conducting a portion of the heat from the first heat spreader to the first interior surface of the enclosure and remaining heat to a second heat spreader through a plurality of heat pipes, wherein the plurality of heat pipes are thermally coupled to the first heat spreader and the second heat spreader; and
    conducting heat from the second heat spreader to a second interior surface of the enclosure through an attachment of the second heat spreader to the second interior surface of the enclosure, wherein the second interior surface corresponds to a surface area of a side panel, and wherein the side panel is within an interior volume of the enclosure.

11. The method of claim 10, further comprising:
    forming a first plurality of grooves on a surface of the first heat spreader, wherein the first plurality of grooves are parallel to a first axis of the enclosure; and
    forming a second plurality of grooves on a surface of the second heat spreader, wherein the second plurality of grooves are parallel to a second axis of the enclosure perpendicular to the first axis.

12. The method of claim 11, further comprising:
    positioning a first section, of the plurality of heat pipes within the first plurality of grooves; and
    positioning a second section of the plurality of heat pipes within the second plurality of grooves such that the plurality of heat pipes extend from the first plurality of grooves to the second plurality of grooves.

13. The method of claim 12, wherein the first section of the plurality of heat pipes is positioned perpendicular to the second section of the plurality of heat pipes.

14. The method of claim 10, wherein the plurality of heat pipes extend from the first heat spreader to the second heat spreader, and wherein the plurality of heat pipes are along at least one of a horizontal axis of the enclosure or a vertical axis of the enclosure.

15. The method of claim 10, further comprising:
forming a first plurality of cavities within the first heat spreader configured to enclose a first section of the plurality of heat pipes; and
forming a second plurality of cavities within the second heat spreader configured to enclose a second section of the plurality of heat pipes.

16. The method of claim 10, wherein the first heat spreader is thermally coupled to the inverter subsystem or the first interior surface of the enclosure using at least one of a thermal epoxy, a soldering process, or a brazing process.

17. An electric vehicle system comprising:
an inverter subsystem configured to provide power to at least one of a traction motor or a pump motor;
a passive cooling enclosure configured to control a temperature of the inverter subsystem, wherein the passive cooling enclosure includes a first heat spreader thermally coupled to the inverter subsystem and attached to a first interior surface of the passive cooling enclosure and configured to absorb heat from the inverter subsystem and conduct heat to the first interior surface of the enclosure, and a second heat spreader attached to a second interior surface of the passive cooling enclosure and configured to conduct heat to the second interior surface of the enclosure, wherein the second interior surface corresponds to a surface area of a side panel, and wherein the side panel is within an interior volume of the enclosure, the passive cooling enclosure includes a plurality of heat pipes thermally coupled to the first heat spreader and the second heat spreader, the plurality of heat pipes configured to transfer heat from the first heat spreader to the second heat spreader.

18. The electric vehicle system of claim 17, wherein the first heat spreader includes a first plurality of grooves parallel to a first axis of the enclosure and the second heat spreader includes a second plurality of grooves parallel to a second axis of the enclosure perpendicular to the first axis.

19. The electric vehicle system of claim 18, wherein a first section of the plurality of heat pipes is positioned within the first plurality of grooves and a second section of the plurality of heat pipes is positioned within the second plurality of grooves, the plurality of heat pipes extending from the first plurality of grooves to the second plurality of grooves.

20. The electric vehicle system of claim 19, wherein the first section of the plurality of heat pipes is positioned perpendicular to the second section of the plurality of heat pipes.

* * * * *